US006134761A

United States Patent [19]

Usui

[11] Patent Number: 6,134,761

[45] Date of Patent: Oct. 24, 2000

[54] METHOD OF MANUFACTURING MULTI-LAYER TYPE INK JET RECORDING HEAD

[75] Inventor: Minoru Usui, Nagano, Japan

[73] Assignee: Seiko Epson Corporation, Tokyo, Japan

[21] Appl. No.: 08/898,726

[22] Filed: Jul. 22, 1997

Related U.S. Application Data

[62] Division of application No. 08/543,891, Oct. 17, 1995, Pat. No. 5,956,059.

[30] Foreign Application Priority Data

| | | | |
|---|---|---|---|
| Oct. 17, 1994 | [JP] | Japan | 6-277024 |
| Sep. 22, 1995 | [JP] | Japan | 7-269186 |

[51] Int. Cl.[7] .......... H01L 41/22

[52] U.S. Cl. .......... 29/25.35; 347/71

[58] Field of Search .......... 29/25.35; 347/40, 347/71, 69, 70

[56] References Cited

U.S. PATENT DOCUMENTS

| | | | |
|---|---|---|---|
| 4,611,219 | 9/1986 | Sugitani et al. | 346/140 R |
| 4,680,595 | 7/1987 | Cruz-Uribe et al. | 346/140 R |
| 4,730,197 | 3/1988 | Raman et al. | 346/140 R |
| 4,766,671 | 8/1988 | Utsumi et al. | 29/848 |
| 5,237,343 | 8/1993 | Osada | 346/140 |
| 5,376,856 | 12/1994 | Taketuchi et al. | 310/328 |
| 5,512,793 | 4/1996 | Takeuchi et al. | 310/328 |
| 5,617,127 | 4/1997 | Takeuchi et al. | 347/71 |
| 5,643,379 | 7/1997 | Takeuchi et al. | 156/89 |
| 5,748,214 | 5/1998 | Usui et al. | 347/70 |
| 5,831,651 | 11/1998 | Usui et al. | 347/70 |

FOREIGN PATENT DOCUMENTS

| | | | |
|---|---|---|---|
| 0486256 | 5/1992 | European Pat. Off. | B41J 2/15 |
| 0584823 | 3/1994 | European Pat. Off. | B41J 2/16 |
| 0613196 | 8/1994 | European Pat. Off. | H01L 41/09 |
| 640030 | 2/1994 | Japan | B41J 2/045 |

*Primary Examiner*—Carl E. Hall

*Attorney, Agent, or Firm*—Sughrue, Mion, Zinn, Macpeak & Seas, PLLC

[57] ABSTRACT

Green sheets of ceramic are stacked and sintered, to form a pressure-generating-chamber forming member 7 which forms pressure generating chambers 4 with its one surface sealed with an elastic board 2, a flow path regulating board 61 which has flow path regulating holes 60 which apply flow path resistance to ink supplying paths connected to the pressure generating chambers 4, and a common-ink-chamber forming board 18 which has a common ink chamber 19 which is communicated through the flow path regulating holes 60 with the pressure generating chambers 4 which are joined together with no adhesive layer, thus providing a flow path forming member. A green sheet of piezoelectric material is laid on the surface of the elastic board 2, and sintered, to form piezo-electric vibrating plates 3 thereon. The flow path forming member is great in mechanical strength, and is prevented from being bent by the contraction which may occurs when the piezo-electric material is sintered. In addition, the through-holes in the components of the flow path forming member can be corrected in position or in configuration when they are in the form of green sheets.

3 Claims, 5 Drawing Sheets

METHOD OF MANUFACTURING MULTI-LAYER TYPE INK JET RECORDING HEAD

This is a divisional of Application No. 08/543,891 filed Oct. 17, 1995 now U.S. Pat. No. 5,956,059.

BACKGROUND OF THE INVENTION

1. Field of the Invention

This invention relates to a recording head comprising pressure chambers in communication with nozzle openings, and thin piezo-electric vibrating plates bonded to parts of the pressure chambers, wherein the pressure chambers are compressed by the piezo-electric vibrating plates to form ink droplets, and more particularly to an ink jet recording head in which a piezo-electric board, pressure chamber forming members, and an elastic board are provided in the form of multi-layers.

2. Related Art

A conventional ink jet recording head includes piezo-electric vibrating plates bonded to portions of an elastic board where pressure generating chambers are formed, wherein the piezo-electric vibrating plates are bent to change the volumes of the pressure generating chambers to form ink droplets. This ink jet recording head is advantageous in that the ink droplets are formed stably because the pressure generating chambers are widely changed in volume.

A conventional ink jet recording head of this type has been disclosed by Japanese Patent Application (OPI) No. 40030/1994 (the term "OPI" as used herein means an "unexamined publication application"). This type of recording head is formed by sintering green sheets. More specifically, an elastic board of ceramic which is formed into a vibrating member, a pressure-generating-chamber forming member which forms pressure generating chambers, and a lid member of ceramic which seals a surface of the pressure-generating-chamber forming member and which has communicating holes through which the pressure generating chambers are in communication with an ink supplying hole and communicating holes through which the pressure generating chambers are in communication with nozzle holes are joined together. Electrodes are formed on the elastic board, and in addition piezo-electric vibrating plates are formed on the elastic board by sintering piezo-electric material, to form an ink pump member.

The ink pump member thus formed is adhesively bonded onto the laminate which is made up of: an ink-chamber forming board of metal which has a common ink chamber; and a nozzle member which has nozzle openings.

In the case where the piezo-electric vibrating plates are employed as actuators for expanding and contracting the pressure generating chambers, in order to simplify the adhesion work or to improve the reliability of the adhesion, a method is employed in which a green sheet of piezo-electric material is applied to the vibrating plates, and sintered.

However, the above-described method of forming a conventional ink jet recording head suffers from the following difficulties: The piezo-electric material contracts during sintering, so that the ink pump member bends or swells. Hence, especially in the manufacture of a high-resolution recording head in which, for instance, ninety (90) nozzle openings are arranged in one line per 2.54 mm, it is rather difficult to join the ink pump member to the laminate of the common ink chamber forming board and the nozzle plate. Even if the ink pump member is joined to the laminate, the nozzle openings are adversely affected in their orientation, so that the resultant print is low in quality.

On the other hand, the ceramic material contracts when sintered. Therefore, even if it is sintered with its rate of contraction taken into account so that it is positioned accurately with respect to the common-ink-chamber forming board and the nozzle plate which are not contracted, errors occur depending on the sintering conditions and the delicate variation in composition of the ceramic material. As a result, in the manufacture of the above-described high-resolution recording head, the yield is low.

SUMMARY OF THE INVENTION

In view of the foregoing, an object of the invention is to provide a multi-layer type ink jet recording head, in the manufacture of which its body is scarcely bent or swelled during sintering, and through-holes forming the ink flow path are positioned with high accuracy.

Another object of the invention is to provide a method of manufacturing the multi-layer type ink jet recording head thus featured.

The foregoing objects have been achieved by forming a multi-layer type ink jet recording head as follows:

The following four items are stacked in the stated order, and joined together with no adhesive layer: That is, (a) an elastic board of ceramic which has piezo-electric vibrating plates on the surface, thus serving as a vibrating member; (b) a pressure-generating-chamber forming member of ceramic which forms pressure generating chambers with one surface thereof sealed with the elastic board; (c) a flow path regulating board which has flow path regulating holes which apply flow path resistance to ink supplying paths connected to the pressure generating chambers, and communicating holes which are communicated with the pressure generating chambers; and (d) a common-ink-chamber forming board which has a common ink chamber which is communicated through the flow path regulating holes with the pressure generating chambers, and communicating holes which are communicated with the pressure generating chambers, are stacked in the stated order and joined together with no adhesive layer. The piezo-electric vibrating plates are secured to the parts of the elastic board which are in alignment with the pressure generating chambers, and the other surface of the common-ink-chamber forming board is sealed with a nozzle plate of metal having nozzle openings communicated with the pressure generating chambers.

The green sheets which are formed into the elastic board, the spacer, the flow path regulating board, and the common-ink-chamber forming board, are stacked, and then subjected to sintering. Hence, the resultant product is high in mechanical strength. Therefore, in the case where the piezo-electric vibrating plates are formed by sintering, the piezo-electric vibrating plates are not bent by the contraction of the piezo-electric material. In forming all the members except the nozzle plate, the green sheets are stacked and then sintered. Hence, the positional accuracies of those members are maintained as high as those of the green sheets when stacked, irrespective of their different rates of contraction.

DETAILED DESCRIPTION OF THE PREFERRED EMBODIMENTS

The invention will be described with reference to its preferred embodiments shown in the accompanying drawings.

Figure 1:
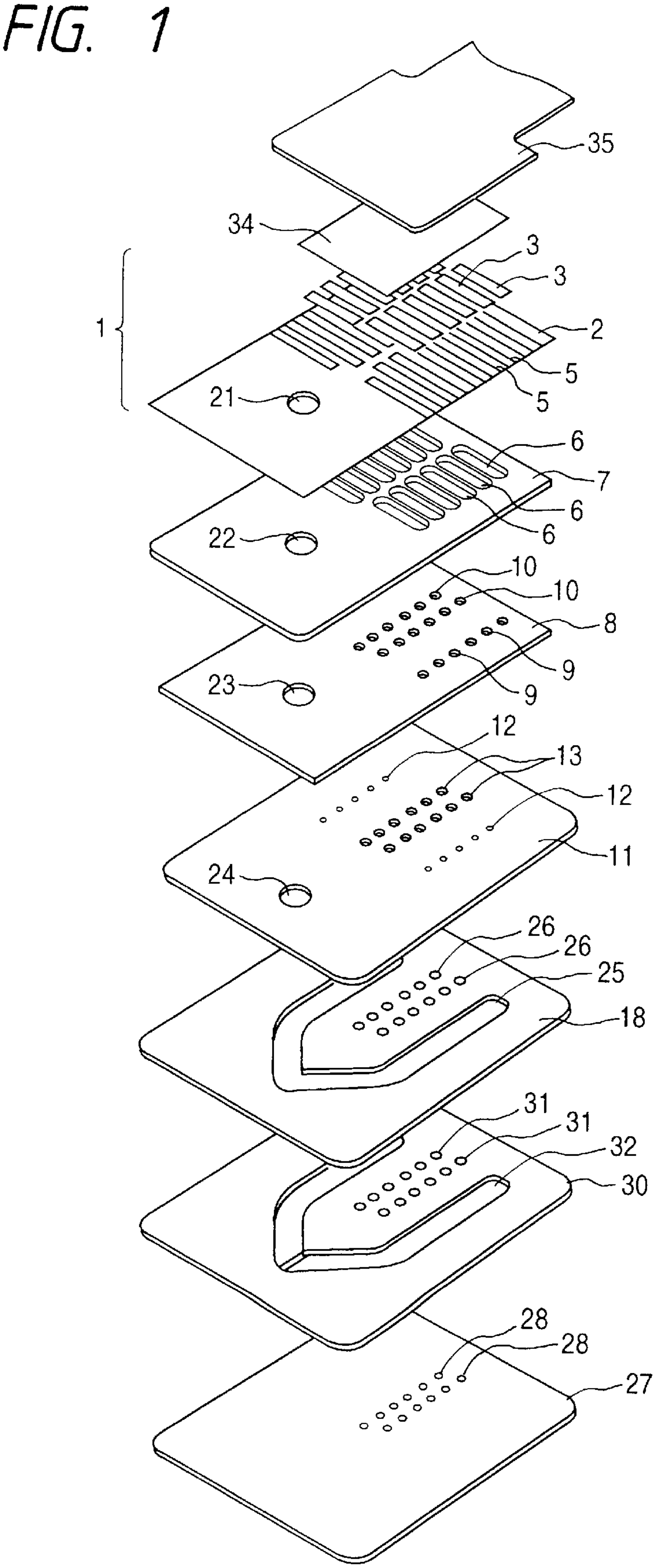
FIG. 1 is an exploded perspective view showing an example of a multi-layer type ink jet recording head, which constitutes a first embodiment of the invention.
Figure 2:
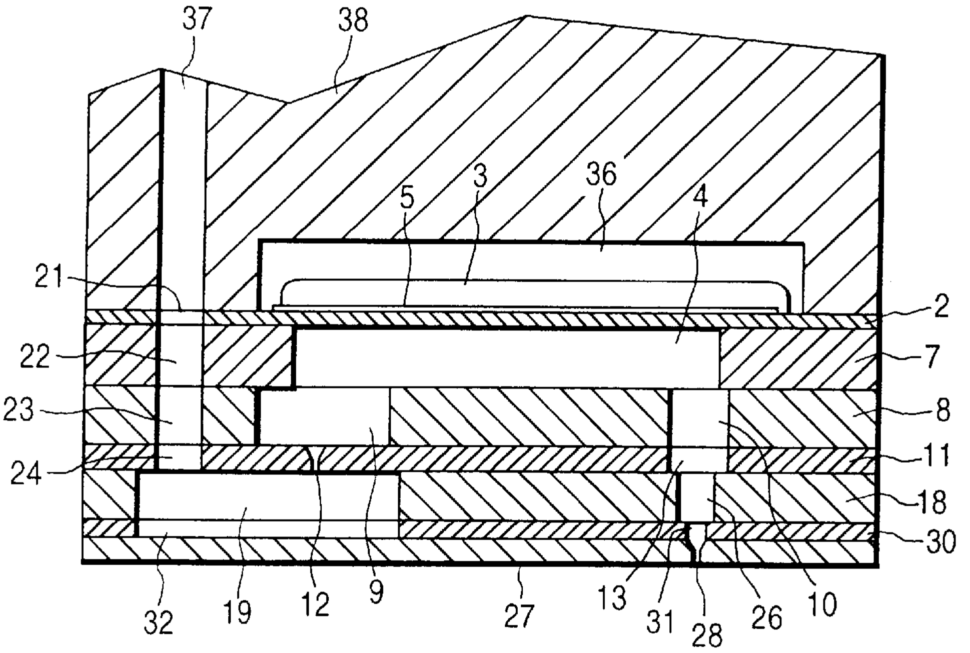
FIG. 2 is a sectional view of the ink jet recording head shown in FIG. 1.

FIG. 1 is an exploded perspective view of a multi-layer Ad type ink jet recording head, which constitutes a first embodiment of the invention, and FIG. 2 is a sectional view showing one of the pressure generating chambers connected to one common ink chamber, and components around it. In FIGS. 1 and 2, reference numeral 1 designates a piezo-electric vibration drive section. The section 1 comprises: an elastic board 2 about 7 to 9 μm in thickness which is made of a thin plate of ceramic, preferably of zirconium oxide ($ZrO_2$) (hereinafter referred to as "zirconia", when applicable); drive electrodes 5 of platinum formed on the elastic board 2; and piezo-electric vibrating plates 3 of PZT about 12 to 14 μm in thickness which are formed on the drive electrodes 5 by sintering. The drive electrodes 5 have a Young's modulus that is substantially equal to the Young's modulus of the elastic board 2, and are positioned in alignment with pressure generating chambers 4 (described later).

Reference numeral 7 designates a spacer made of a ceramic plate of zirconia or the like. The spacer 7 is for instance 150 μm in thickness so that it is suitable for formation of the pressure generating chambers 4, and has elongated through-holes 6 arranged at predetermined intervals which are equal in configuration to the pressure generating chambers 4. The pressure generating chambers 4 are, for instance, each about 190 to 210 μm in width and about 2 mm in length so that nozzle openings 28 be arranged with a pitch of 90 dpi. The drive electrodes 5 are each about 140 μm in width (about 70% of the width of the pressure generating chambers 4), and are arranged symmetrical with respect to the common central line of the pressure generating chambers 4.

Reference numeral 8 designates a lid member of zirconia which seals the pressure generating chambers 4 on the opposite side. The lid member 8 has first communicating holes 9 which are connected to first ends of the pressure generating chambers, and second communicating holes 10 which are connected to the remaining second ends of the pressure generating chambers 4.

Reference numeral 11 designates a flow path regulating board which is fixedly secured through its one surface to the lid member 8. The flow path regulating board 11 has flow path regulating holes 12 which are gradually larger in diameter towards the first communicating holes 9, and third communicating holes 13 in alignment with the second communicating holes 10 in such a manner that they are communicated with the nozzle openings 28.

The elastic board 2, the spacer 7, the lid member 8, and the flow path regulating board 11 have ink supplying holes 21, 22, 23 and 24 in their end portions, respectively, which are communicated with one another and are connected to an ink tank,(not shown).

Reference numeral 18 denotes the aforementioned common-ink-chamber forming board which is made of a plate of zirconia for instance 150 μm in thickness which is suitable for formation of the board 18. The common-ink-chamber forming board 18 has a substantially V-shaped window 25 whose configuration corresponds to that of the common ink chamber 19 (see FIGS. 2–5), and fourth communicating holes 26 through which the pressure generating chambers 4 are communicated with the nozzle openings 28, respectively.

The elastic board 2, the spacer 7, the lid member 8, the flow path regulating board 11, and the common-ink-chamber forming board 18 are laid one on another when they are in the form of green sheets, and then they are joined together by sintering, thus providing a flow path forming member.

Reference numeral 27 designates a nozzle plate made of a metal plate such as a stainless steel plate which shows a high corrosion resistance against ink. The nozzle plate 27 has the aforementioned nozzle openings 28 in correspondence to the pressure generating chambers 4. The nozzle plate 27 is bonded to the common-ink-chamber forming board 18 through an adhesive layer 30 of thermal adhesive film in such a manner that the nozzle openings 28 are communicated with the pressure generating chambers 4 through the communicating holes 10, 13 and 26.

The adhesive layer 30 has fifth communicating holes 31 and a second substantially V-shaped window 32 which are in alignment with the communicating holes 26 and the window 25 of the ink chamber forming board 18, respectively. That is, the adhesive layer 30 is to thermally bond the nozzle plate 27 to the flow path forming member in such a manner that the flow path is not obstructed thereby.

In FIG. 1, reference numeral 34 designates a common electrode formed over the piezo-electric vibrating plates; and 35, a flexible cable through which the electrodes are connected to an external device.

As shown in FIG. 2, the ink jet recording head thus constructed is fixedly mounted on a base 38; that is, it is mounted through the base 38 on the carriage of the printer. The base 38 has a recess 36 which allows vibration of the piezo-electric vibrating plates 3, and a through-hole 37 which is an ink flow path through which the ink supplying hole 21 is communicated with the ink tank.

A method of manufacturing the above-described multi-layer type ink jet recording head will be described with reference to FIG. 3.

Figure 3A:
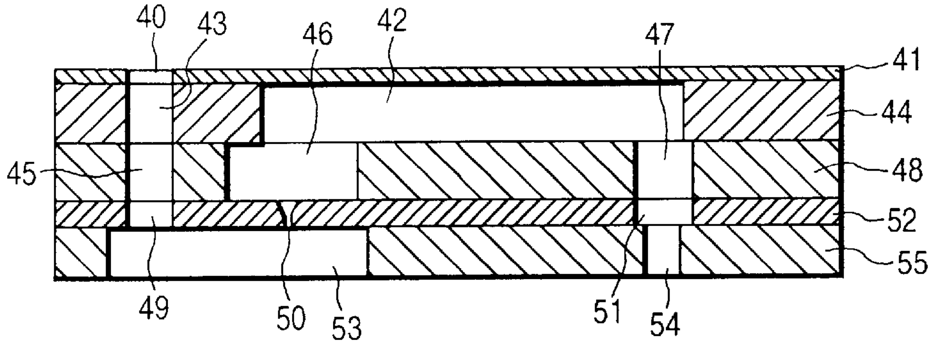
FIGS. 3(*a*)–3(*c*) are sectional views showing the steps of manufacturing the recording head shown in FIG. 1.
Figure 3B:
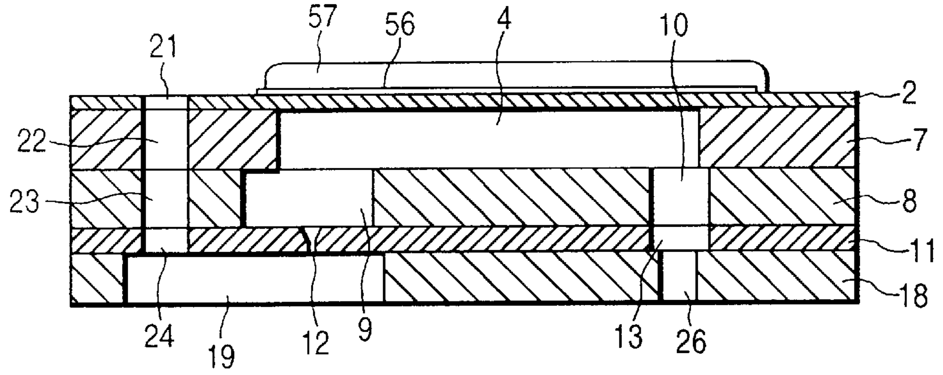
Figure 3C:
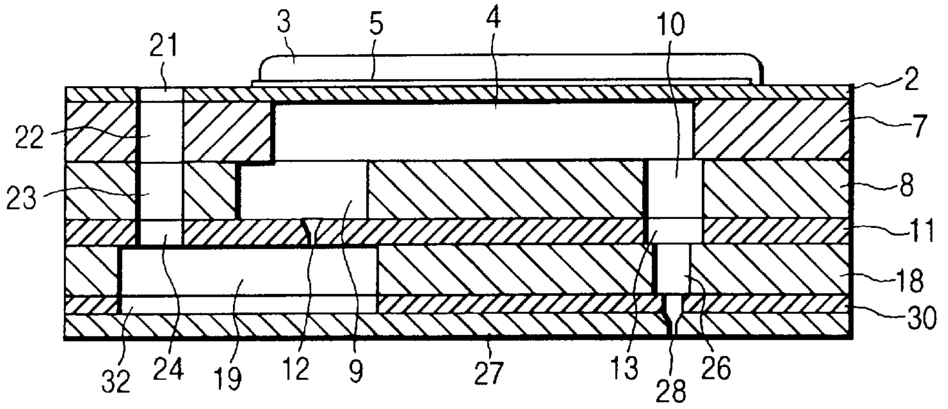

As shown in FIG. 3(*a*), green sheets 41, 44, 48, 52 and 55 of zirconia are laid one on another in the stated order, and sintered at a temperature which is suitable for sintering zirconia. The green sheet 41 has a through-hole 40 which will become the ink supplying hole 21; that is, it is formed into the elastic board 2. The green sheet 44 has a through-hole 42 which will become the ink supplying hole 22, and through-holes 43 which will provide the pressure generating chambers 4; that is, the ink supplying hole 22 and the pressure generating chambers 4 are formed into the spacer 7. The green sheet 48 has a through-hole 45 which will become the ink supplying hole 23, through-holes 46 which will become the first communicating holes 9 connected to the first ends of the pressure generating chambers 4, and through-holes 47 which will become the second communicating holes 10 which are connected to the remaining second ends of the pressure generating chambers 4; that is, the ink supplying hole 23, the first communicating holes 9, and the second communicating holes 10 are formed into the lid member 8. The green sheet 52 has a through-hole 49 which will become the ink supplying hole 24, through-holes 50 which will become the flow path regulating holes 12, and through-holes 51 which will become the third communicating holes 13 which are communicated with the nozzle openings 28; that is, the ink supplying hole 24, the flow path regulating holes 12, and the third communicating holes 13 are formed into the flow path regulating board 11. The green sheet 55 has a window 53 which will become the common ink chamber 19, and through-holes 54 which will become the fourth communicating holes 26; that is, the common ink chamber 19 and fourth communicating holes 26 are formed into the common ink chamber forming board .18.

The green sheets 41, 44, 48, 52 and 55 are formed into the elastic board 2, the spacer 7, the lid member 8, the flow path regulating board 11, and the common ink chamber forming board 18 by sintering, respectively. That is, they are provided as one ceramic unit with no adhesive layer.

On the surface of the elastic board 2 thus formed, a drive electrode pattern 56 (see FIG. 3(*b*)) is formed by vapor deposition, sputtering, or coating. In conformance with the drive electrode pattern 56, paste-like piezo-electric material is applied to the elastic board 2 or a green sheet 57 of piezo-electric material is bonded to the latter 2, and then sintered to form the piezo-electric vibrators 3.

As a result, the piezo-electric vibrating plates 3 are fixed through the drive electrodes 5 to the elastic board 2 in such a manner that they are in alignment with the pressure generating chambers 4.

With the recording head of the invention, after the elastic board 2, the spacer 7, the lid member 8, the flow path regulating board 11, and the common-ink-chamber forming board 18 have been formed into one unit by sintering, the piezo-electric material sintering operation is carried out. Hence, the recording head is high in mechanical strength when compared with a conventional one in which the piezo-electric vibrating plates are formed by sintering before the elastic board, the spacer, and the lid member have been formed by sintering. Therefore, the recording head of the invention is substantially free from the difficulty that it is bent because the paste-like or green-sheet-shaped piezo-electric material contracts during sintering.

In the case where the nozzle openings are arranged with a high density of about 90 dpi, the first communicating holes 9 and the second communicating holes 10 are unavoidably arranged with high density. If, in this case, the members 2, 7, 11 and 18 are bent even slightly, then the leakage of ink is liable to occur at the adhesive layer 30, thus adversely affecting the ink jetting performance. As was described above, the recording head of the invention is substantially prevented from being bent during sintering. This feature maintains all the nozzle openings unchanged in ink jetting characteristics.

Finally, the nozzle plate 27 is prepared by forming the nozzles openings 28 in a metal plate such as a stainless steel plate which is corrosion-resistant against ink. The nozzle plate 27 is bonded through the adhesive layer 30 to the ink chamber forming board 18. Thus, the first embodiment of the ink jet recording head has been manufactured.

The ink jet recording head thus manufactured operates as follows:

When drive signals are applied to the piezo-electric vibrating plates 3, the elastic board 2 is bent towards the pressure generating chambers 4 to contract the latter 4. As a result, the ink in the pressure generating chambers 4 is sent through the communicating holes 10, 13, 26 and 31 to the nozzle openings 28, thus being jetted as ink droplets.

After the formation of the ink droplets, the application of the drive signals is suspended, so that the piezo-electric vibrating plates 3 are restored to expand the pressure generating chambers 4. As a result, a quantity of ink used for the formation of ink droplets is supplied from the common ink chamber 19 (see FIGS. 2–5) through the flow path regulating holes 12 into the pressure generating chambers 4.

The above-described operation is repeatedly carried out, to achieve the given printing operation.

In the above-described embodiment, the lid member 8 and the flow path regulating board 11 are provided as individual components so that the recording head is large in thickness, and accordingly sufficiently high in mechanical strength.

Figure 4:
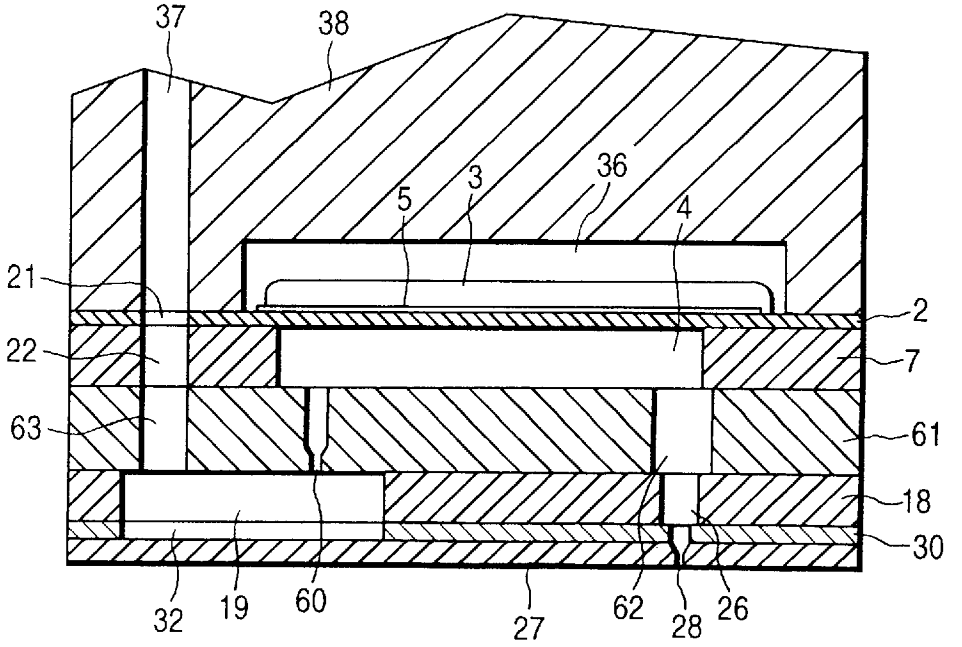
FIG. 4 is a sectional view of another example of the multi-layer type ink jet recording head, which constitutes a second embodiment of the invention.

However, the flow path regulating board and the lid member may be provided as one unit as shown in FIG. 4. That is, FIG. 4 shows another example of the ink jet recording head, which constitutes a second embodiment of the invention. In the second embodiment, as shown in FIG. 4, a flow path regulating board 61 having flow path regulating holes 60 is made larger in thickness than the one in the first embodiment so that it serves also as the lid member. This feature reduces the number of green sheets to be used for manufacture of the recording head, which contributes to a simplification of the recording head manufacturing work.

In FIG. 4, reference numeral 62 designates communicating holes through which the pressure generating chambers 4 are communicated with the nozzle openings 28; and 63 designates an ink supplying hole.

Figure 5A:
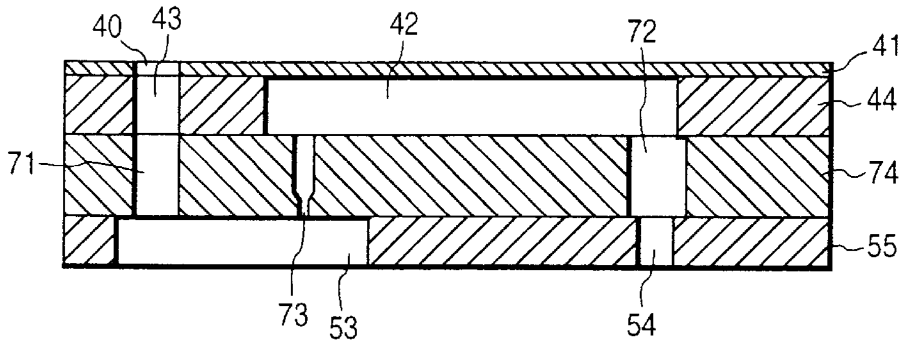
FIGS. 5(*a*)–5(*c*) are sectional views showing the steps of manufacturing the recording head shown in FIG. 4.
Figure 5B:
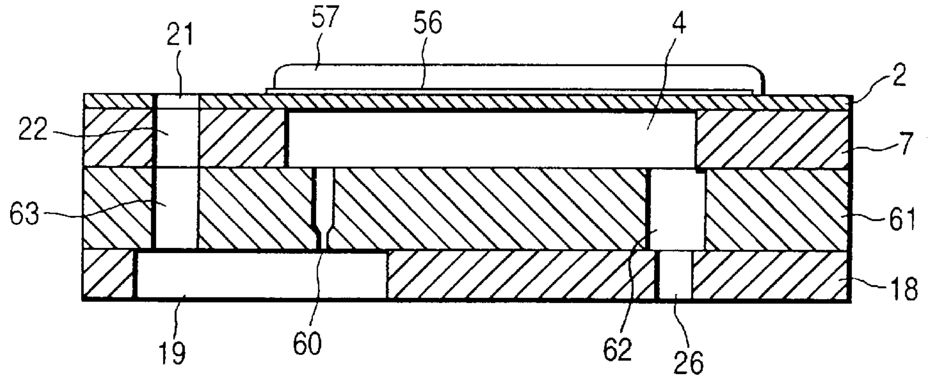
Figure 5C:
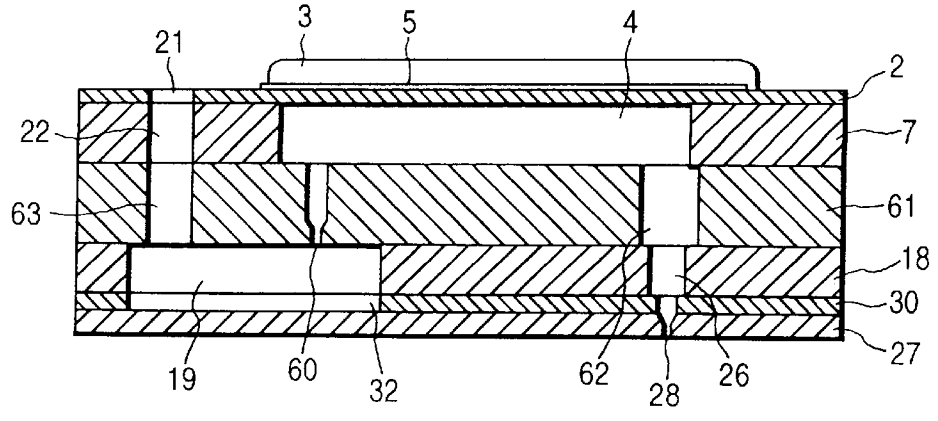

In the second embodiment, the green sheets 41 and 44 of zirconia, a green sheet 74 of zirconia, and a green sheet 55 of zirconia are laid one on another in the stated order, and sintered at a temperature which is suitable for sintering zirconia, as shown in FIG. 5(*a*). As was described before, the green sheet 41 has the through-hole 40 which will become the ink supplying hole 21; that is, it is formed into the elastic board 2. The green sheet 44 has the through-hole 43 which will become the ink supplying hole 22, and through-holes 42 which will provide the pressure generating chambers 4; that is, the ink supplying hole 22 and the pressure generating chambers 4 are formed into the spacer 7. The green sheet 74 has a through-hole 71 which will become the ink supplying hole 63, through-holes 72 which are connected to the first ends of the pressure generating chambers 4, and through-holes 73 which will become the flow path regulating holes 60; that is, the ink supplying hole 63 and the flow path regulating hole 60 are formed into the flow path regulating board 61. The green sheet 55, as was described before with respect to the first embodiment, has a window 53 which will become the common ink chamber 19, and through-holes 54; that is, the common ink chamber 19 and the through-holes 54 are formed into the common-ink-chamber forming board 18.

The green sheets 41, 44, 74 and 55 are formed into the elastic board 2, the spacer 7, the flow path regulating board 61, and the common ink chamber forming board 18 by sintering, respectively. That is, they are provided as one ceramic unit with no adhesive layer.

Thereafter, the drive electrode pattern 56 is similarly formed on the surface of the elastic board 2. And in conformance with the drive electrode pattern thus formed, paste-like piezo-electric material is applied to the elastic board 2, or a green sheet 57 of piezo-electric material is bonded to the latter, and then sintered (see FIG. 5(*b*)) to form the piezo-electric vibrators 3.

Finally, the nozzle plate 27 is prepared by forming the nozzles openings 28 in a metal plate such as a stainless steel plate which shows a high corrosion resistance against ink. The nozzle plate 27 is bonded through the adhesive layer 30 of thermally adhesive film or the like to the ink chamber forming board 18. Thus, the second embodiment of the ink jet recording head has been manufactured.

For instance, in the second embodiment shown in FIG. 5, it is preferable that firstly the green sheets 44, 74 and 55, which are formed into the spacer 7, the flow path regulating board 61, and the common-ink-chamber forming board 18, respectively, are stacked one on another, and secondly the green sheet 41, which is formed into the elastic board 2, is laid on the stack of the green sheets 44, 74 and 55, and thirdly those four green sheets 41, 74, 47 and 55 are sintered into one unit.

Figure 6:
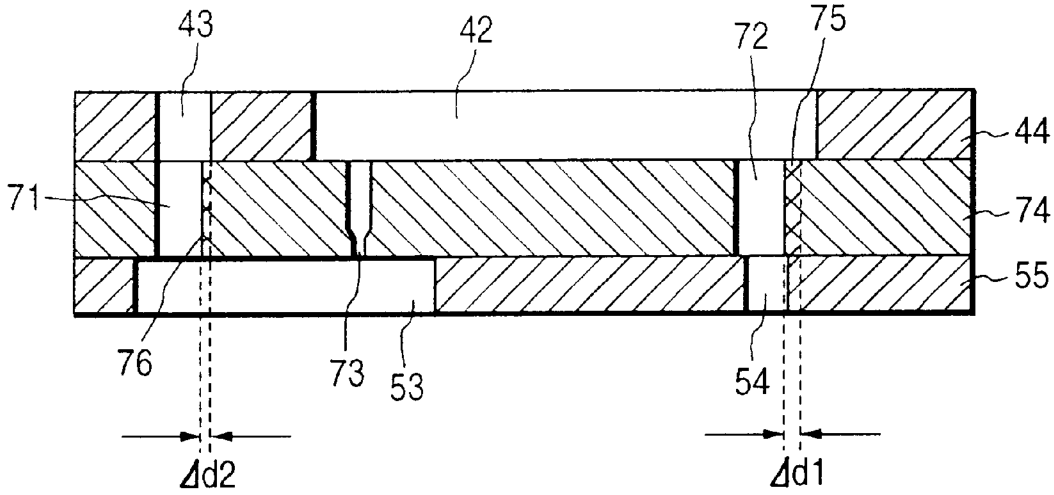
FIG. 6 is a sectional view for a description of a step of correcting the configuration or position of through-holes which may be effected in the manufacture of the recording head according to the invention.

In the third embodiment, similarly as in the second embodiment, the green sheets 44, 74 and 55 of zirconia are stacked one on another in the stated order as shown in FIG. 6. As was described above, the green sheet 44 has the through-hole 43 which will become the ink supplying hole 22, and through-holes 42 which will provide the pressure generating chambers 4; that is, the ink supplying hole 22 and pressure generating chambers 4 are formed into the spacer 7. The green sheet 74 has a through-hole 71 which will become the ink supplying hole 63, the through-holes 72 which are connected to the first ends of the pressure generating chambers 4, and the through-holes 73 which will become the flow path regulating holes 60. The green sheet 55, as was described before, has the window 53 which will become the common ink chamber 19, and the through-holes 54. In this step, it is determined whether or not a positional shift Δd1 is present between the holes 43 and 71, and it is also determined whether or not a positional shaft Δd2 is present between the holes 72 and 54 (see FIG. 6).

In the case where the holes are shifted from each other or deformed, their portions 76 and 75 (cross-hatched in FIG. 6) which are relatively protruded inwardly of the holes must be modified or removed by shaving or laser machining. As is well known in the art, ceramic material can be readily machined before sintered. Hence, those holes can be corrected with high accuracy.

After the holes have been corrected in the above-described manner, the green sheet 41, which will become the elastic board 2, is laid on the stack of the green sheets 44, 74 and 55. And, similarly as in the above-described case, those green sheets 41, 44, 74 and 55 are sintered.

When sintered, the green sheets 44, 74 and 55 having the through-holes defining the ink flow path, may be contracted, thus affecting the positions of those through-holes. This difficulty can be eliminated by the following method because the green sheets 44, 74 and 55 are substantially equal in composition to each other and accordingly have substantially equal rates of contraction. In the step of stacking the green sheets 44, 74 and 55, the holes 43, 71, 72, 73 and 54 are positioned, and, when necessary, modified in the above-described manner (i.e. shaving or laser machining). By sintering the green sheets thus treated, a recording head can be obtained in which the holes 43, 71, 72, 73 and 54 are connected with high positional accuracy. This will improve the yield in the manufacture of the recording head.

As was described above, the multi-layer type ink jet recording head of the invention comprises: the elastic board 2 of ceramic which has the piezo-electric vibrating plates 3 on the surface, thus serving as the vibrating member; the pressure-generating-chamber forming member 7 of ceramic which forms the pressure generating chambers 4 with one surface thereof sealed with the elastic board 2; the flow path regulating board 11 which has the flow path regulating holes 12 which apply flow path resistance to the ink supplying paths 9 connected to the pressure generating chambers 4, and the communicating holes 10 which are communicated with the pressure generating chambers 4; the common-ink-chamber forming board 18 which has the common ink chamber 19 which is communicated through the flow path regulating holes 12 with the pressure generating chambers 4, and the communicating holes 26 which are communicated with the pressure generating chambers 4. The elastic board 2, the pressure-generating-chamber forming member 7, the flow path regulating board 11, and the ink chamber forming board 18 are fixedly stacked in the stated order with no adhesion layer in such a manner that the piezo-electric vibrating plates 3 are in alignment with the pressure generating chambers 4. And the other surface of the common-ink-chamber forming board 18 is sealed with the nozzle plate 27 of metal having the nozzle openings 28 in communication with the pressure generating chambers 4.

Hence, the communicating condition of the through-holes in the members such as the spacer 7, the flow path regulating board 11, and the common-ink-chamber forming board 18 can be readily adjusted. In addition, after the elastic board 2, the spacer 7, the flow path regulating board 11, and the common-ink-chamber forming board 18 are formed into one unit, the green sheet of piezo-electric material which is formed into the vibrating plates can be subjected to sintering. This feature increases the mechanical strength of the flow path forming member which is a base body in sintering the piezo-electric material, and substantially eliminates the difficulty that the flow path forming member is deformed, for instance bent, when the green sheet of piezo-electric material is sintered. Moreover, the green sheets which are used to form the flow path forming member are substantially equal in composition to one another, and are sintered at the same time. This feature minimizes the amount of positional shift between the through-holes due to the contraction of the material due to the sintering operation, and improves the yield in the manufacture of the recording head.

The adhesive is employed only to join the nozzle plate and the flow path forming member with each other. Hence, the recording head is free from the difficulties that the adhesive flows into the through-holes, and the nozzle plate is insufficiently bonded to the flow path forming member. Thus, the adhesion work can be readily and positively achieved.

What is claimed is:

1. A method of manufacturing a multi-layer ink jet recording head, comprising:

laminating a green sheet of zirconia whose thickness is suitable for formation of an elastic board, a green sheet of zirconia having through-holes for forming pressure generating chambers, a green sheet of zirconia having through-holes serving as flow path regulating holes, through-holes communicating with nozzle openings, and a through-hole through which ink is supplied into a common ink chamber, and a green sheet of zirconia having a window for forming the common ink chamber and through-holes through which the nozzle openings are communicated with the pressure chambers, to form a stack of green sheets;

sintering the stack of green sheets;

forming a pattern of drive electrodes on a surface of the elastic board and forming piezo-electric vibrators over the drive electrodes by applying a piezo-electric material to the elastic board and sintering the piezo-electric material; and bonding, with an adhesive, a nozzle plate having the nozzle openings to a common-ink-chamber forming board which is formed by the sintering of the green sheet having the window.

2. A method of manufacturing a multi-layer type ink jet recording head as claimed in claim 1, wherein said laminating comprises:

laminating each green sheet in a predetermined order.

3. A method of manufacturing a multi-layer type ink jet recording head as claimed in claim 1, wherein said laminating comprises:

laminating the green sheet of zirconia having through-holes for forming the pressure generating chambers, the green sheet of zirconia having through-holes serving as the flow path regulating holes, through-holes communicating with the nozzle openings, and a through-hole through which ink is supplied into the common ink chamber, and the green sheet of zirconia having the window for forming the common ink chamber and through-holes through which the nozzle openings are communicated with the pressure chambers, to form a first stack of green sheets;

correcting at least one of the positions and configurations of the through-holes in the first stack; and laying on the first stack the green sheet of zirconia whose thickness is suitable for formation of the elastic board, to form a second stack of green sheets, wherein said sintering comprises sintering the second stack of green sheets.

* * * * *